US012740282B2

(12) United States Patent
Kim et al.

(10) Patent No.: US 12,740,282 B2
(45) Date of Patent: Sep. 15, 2026

(54) COLOR PANEL AND DISPLAY APPARATUS INCLUDING THE SAME

(71) Applicant: Samsung Display Co., Ltd., Yongin-si (KR)

(72) Inventors: Jangil Kim, Yongin-si (KR); Jonghoon Kim, Yongin-si (KR); Jeaheon Ahn, Yongin-si (KR); Seokjoon Hong, Yongin-si (KR)

(73) Assignee: SAMSUNG DISPLAY CO., LTD.

( * ) Notice: Subject to any disclaimer, the term of this patent is extended or adjusted under 35 U.S.C. 154(b) by 373 days.

(21) Appl. No.: 18/608,898

(22) Filed: Mar. 18, 2024

(65) Prior Publication Data

US 2024/0268182 A1 Aug. 8, 2024

Related U.S. Application Data

(63) Continuation of application No. 15/931,317, filed on May 13, 2020, now abandoned.

(30) Foreign Application Priority Data

Jul. 23, 2019 (KR) ........................ 10-2019-0089207

(51) Int. Cl.

| | |
|---|---|
| ***H10K 59/38*** | (2023.01) |
| ***H10K 59/126*** | (2023.01) |
| ***H10K 59/80*** | (2023.01) |
| ***H10K 59/88*** | (2023.01) |
| *H10K 102/00* | (2023.01) |

(52) U.S. Cl.

CPC ........... *H10K 59/38* (2023.02); *H10K 59/126* (2023.02); *H10K 59/877* (2023.02); *H10K 59/8792* (2023.02); *H10K 59/88* (2023.02); *H10K 2102/331* (2023.02)

(58) Field of Classification Search

CPC ..... H01L 27/32–3293; H01L 51/50–56; G02F 1/133514; G02F 1/133521; G02F 1/133519; H10K 59/10–38; H10K 59/88; H10K 59/00

See application file for complete search history.

(56) References Cited

U.S. PATENT DOCUMENTS

| | | | |
|---|---|---|---|
| 8,421,982 | B2 | 4/2013 | Kim et al. |
| 10,177,176 | B2 | 1/2019 | Kim et al. |

(Continued)

FOREIGN PATENT DOCUMENTS

| | | | |
|---|---|---|---|
| CN | 102043297 | A | 5/2011 |
| CN | 104749841 | A | 7/2015 |

(Continued)

*Primary Examiner* — Lauren R Bell

(74) *Attorney, Agent, or Firm* — Womble Bond Dickinson (US) LLP

(57) ABSTRACT

According to one or more embodiments, a color panel includes: a substrate including a display area and a non-display area at least partially surrounding the display area, the display area including a plurality of pixel areas; a color filter layer arranged on the substrate to transmit incident light of a particular wavelength band; and a color conversion layer arranged on the color filter layer and including a plurality of quantum dots to convert the incident light into light of a particular wavelength band and to output the converted light, wherein the color conversion layer includes a dummy element that is apart from the display area and is arranged in the non-display area.

17 Claims, 13 Drawing Sheets

(56) References Cited

U.S. PATENT DOCUMENTS

| | | | |
|---|---|---|---|
| 10,192,938 B2 | 1/2019 | Yu et al. |
| 10,249,689 B2 | 4/2019 | Kim et al. |
| 10,551,676 B2 | 2/2020 | Cho et al. |
| 10,571,766 B2 | 2/2020 | Park et al. |
| 10,690,957 B2 | 6/2020 | Lazo Martinez et al. |
| 10,698,255 B2 | 6/2020 | Park et al. |
| 10,705,271 B2 | 7/2020 | Kim et al. |
| 10,761,378 B2 | 9/2020 | Hong et al. |
| 2017/0213872 A1 | 7/2017 | Jinbo et al. |
| 2018/0006093 A1 | 1/2018 | Kim et al. |
| 2018/0052362 A1 | 2/2018 | Kang et al. |
| 2018/0122302 A1 | 5/2018 | Koong |
| 2018/0225503 A1 | 8/2018 | Kim et al. |
| 2018/0275461 A1 | 9/2018 | Park et al. |
| 2019/0049786 A1 | 2/2019 | Lazo Martinez et al. |
| 2019/0079352 A1 | 3/2019 | Park et al. |
| 2019/0162993 A1 | 5/2019 | Hong et al. |
| 2019/0179065 A1 | 6/2019 | Kim et al. |

FOREIGN PATENT DOCUMENTS

| | | |
|---|---|---|
| CN | 107026244 A | 8/2017 |
| CN | 107544174 A | 1/2018 |
| CN | 108628036 A | 10/2018 |
| CN | 109387973 A | 2/2019 |
| CN | 109782497 A | 5/2019 |
| CN | 109904190 A | 6/2019 |
| KR | 10-2018-0047242 A | 5/2018 |
| KR | 10-2018-0050372 A | 5/2018 |
| KR | 10-2018-0063960 A | 6/2018 |
| KR | 10-2018-0079581 A | 7/2018 |
| KR | 10-2018-0092202 A | 8/2018 |
| KR | 10-2019-0016645 A | 2/2019 |
| KR | 10-2019-0062654 A | 6/2019 |

1000
110 130 145 150 470 430 417 415 413 410
NDA
DA
126 L3 146 124 L2 144 122 L1 142
OLED 440 450 460
OLED 440 450 460
OLED 440 450 460
PC PC PC
TFT D G A S
100 400
X Z

COLOR PANEL AND DISPLAY APPARATUS INCLUDING THE SAME

CROSS-REFERENCE TO RELATED APPLICATION

This application is a continuation of U.S. patent application Ser. No. 15/931,317, filed May 13, 2020, which claims priority to and the benefit of Korean Patent Application No. 10-2019-0089207, filed on Jul. 23, 2019, in the Korean Intellectual Property Office, the entire content of each of the two applications is incorporated herein by reference.

BACKGROUND

1. Field

One or more aspects of embodiments of the present disclosure are directed toward a color panel and a display apparatus including the color panel.

2. Description of Related Art

Display apparatus, which are apparatuses for visually expressing data, are used for various purposes in various fields.

Recently, due to diversification in purposes of the display apparatuses, various product designs for improving quality of the display apparatuses have been tried. Particularly, as the display apparatuses have higher resolution, research to improve color gamut of the display apparatuses has been actively performed. Recently, by developing display apparatuses including color conversion elements that include quantum dots, display apparatuses having improved light efficiency and color gamut have been provided.

SUMMARY

In the color conversion elements arranged at a profile in the display area of a related art display apparatus, due to oxidization and/or deterioration, stains may be seen in the display area, or furthermore, reliability errors may occur.

One or more aspects of embodiments of the present disclosure are directed to a color panel having improved display characteristic and reliability and to a display apparatus including the color panel.

Additional aspects will be set forth in part in the description which follows and, in part, will be apparent from the description, or may be learned by practice of the presented embodiments of the disclosure.

According to one or more embodiments, a color panel may include a substrate including a display area including a plurality of pixel areas and a non-display area at least partially surrounding the display area, a color filter layer arranged on the substrate and to transmit incident light of a particular wavelength band, and a color conversion layer arranged on the color filter layer and including a plurality of quantum dots or light-scattering particles, wherein the plurality of quantum dots are to convert the incident light into converted light of a particular wavelength band, different from the wavelength band of the incident light, and output the converted light, wherein the light-scattering particles are to transmit the incident light, and wherein the color conversion layer may further include a dummy element that is apart from the display area and is in the non-display area.

The plurality of pixel areas may include a first pixel area, a second pixel area, and a third pixel area, and the color conversion layer may include a first element to cover a first pixel area, a second element to cover a second pixel area, and a third element to cover a third pixel area, wherein the third element is integrally arranged at a portion of the display area and a portion of the non-display area, and the first element, the second element, the third element, and the dummy element may be separated from one another.

The dummy element may include the same material as that of the first element, the second element, and/or the third element.

The color panel may further include a light-shielding member between the substrate and the color conversion layer, the light-shielding member being in the non-display area and between any two of the plurality of pixel areas.

The color filter layer may include a first color filter to cover a first pixel area, a second color filter to cover a second pixel area, and a third color filter to cover a third pixel area, wherein the color panel may further include a light-shielding color filter between the substrate and the light-shielding member, the light-shielding color filter corresponding to an area between the first pixel area and the second pixel area, and the light-shielding color filter may include the same material as that of the third color filter.

A portion of the third color filter may be between the substrate and the light-shielding member.

The color panel may further include a dummy color filter that is apart from the dummy element and is in at least in a portion of the non-display area, wherein the dummy element may be between the display area and the dummy color filter.

The first element, the second element, the third element, and the dummy element may each correspond to any one of: a first color conversion element including a plurality of quantum dots to convert the incident light into light of a first wavelength band, a second color conversion element including a plurality of quantum dots to convert the incident light into light of a second wavelength band, or a light-transmitting element including light-scattering particles to transmit the incident light.

According to one or more embodiments, a display apparatus may include a display panel including a plurality of emission elements, a color panel on the display panel and having a plurality of pixel areas arranged to overlap the plurality of emission elements, wherein the color panel further includes a substrate including a display area and a non-display area surrounding the display area, the display area including the plurality of pixel areas, a light-shielding member arranged to correspond to the non-display area, a color filter layer to transmit incident light of a particular wavelength band, and a color conversion layer on the color filter layer, wherein the color conversion layer may include a plurality of elements, and one of the plurality of elements may be arranged to extend from the display area to the non-display area.

The color conversion layer may include a first color conversion element to convert incident light into light of a first wavelength band, a second color conversion element to convert incident light into light of a second wavelength band, and a light-transmitting element.

The one of the plurality of elements may include any one selected from the first color conversion element, the second color conversion element, and the light-transmitting element.

The display apparatus may further include a dummy element in the non-display area, wherein the dummy element may be arranged apart from the one of the plurality of elements.

The color filter layer may include a first color filter between the substrate and the first color conversion element to transmit light of a first wavelength band, a second color filter between the substrate and the second color conversion element to transmit light of a second wavelength band, and a third color filter between the substrate and the light-shielding member to transmit light of a third wavelength band.

The dummy element may include the same material as that of at least one selected from the first color conversion element, the second color conversion element, the first color filter, and the second color filter.

According to one or more embodiments, a display apparatus may include a first emission element, a second emission element, a third emission element, a color panel on the display panel, wherein the color panel may include a substrate including a display area and a non-display area at least partially surrounding the display area, a color filter layer on the substrate to transmit incident light of a particular wavelength band, and a color conversion layer on the color filter layer and including a plurality of quantum dots or light-scattering particles, wherein the plurality of quantum dots are to convert the incident light into converted light of a particular wavelength band and output the converted light, wherein the light-scattering particles are to transmit the incident light, and wherein the color conversion layer may include a first element to overlap a first emission element, a second element to overlap a second emission element, a third element to overlap a third emission element, and a dummy element in at least a portion of the non-display area, wherein the first element, the second element, the third element, and the dummy element may be arranged apart from one another.

A portion of the third element of the color conversion layer may extend toward the non-display area and cover a portion of the non-display area.

One selected from the first element, the second element, and the third element may include first quantum dots to convert the incident light into light of a wavelength band of a first color, another one selected from the first element, the second element, and the third element may include second quantum dots to convert the incident light into light of a wavelength band of a second color, and remaining one of the first element, the second element, and the third element may include light-scattering particles.

The dummy element may include that same material as that of any one of the first element, the second element, or the third element.

The color filter layer may include a first color filter to overlap the first element, a second color filter to overlap the second element, and a third color filter to overlap the third element, and the color panel may further include a material portion located between the first color filter and the second color filter and including the same material as that of the third color filter.

The dummy element may include the same material as that of any one or two color filters selected from among the first color filter, the second color filter, and the third color filter.

Other aspects, features, and advantages will be clearly understood from drawings, claims, and detailed descriptions.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
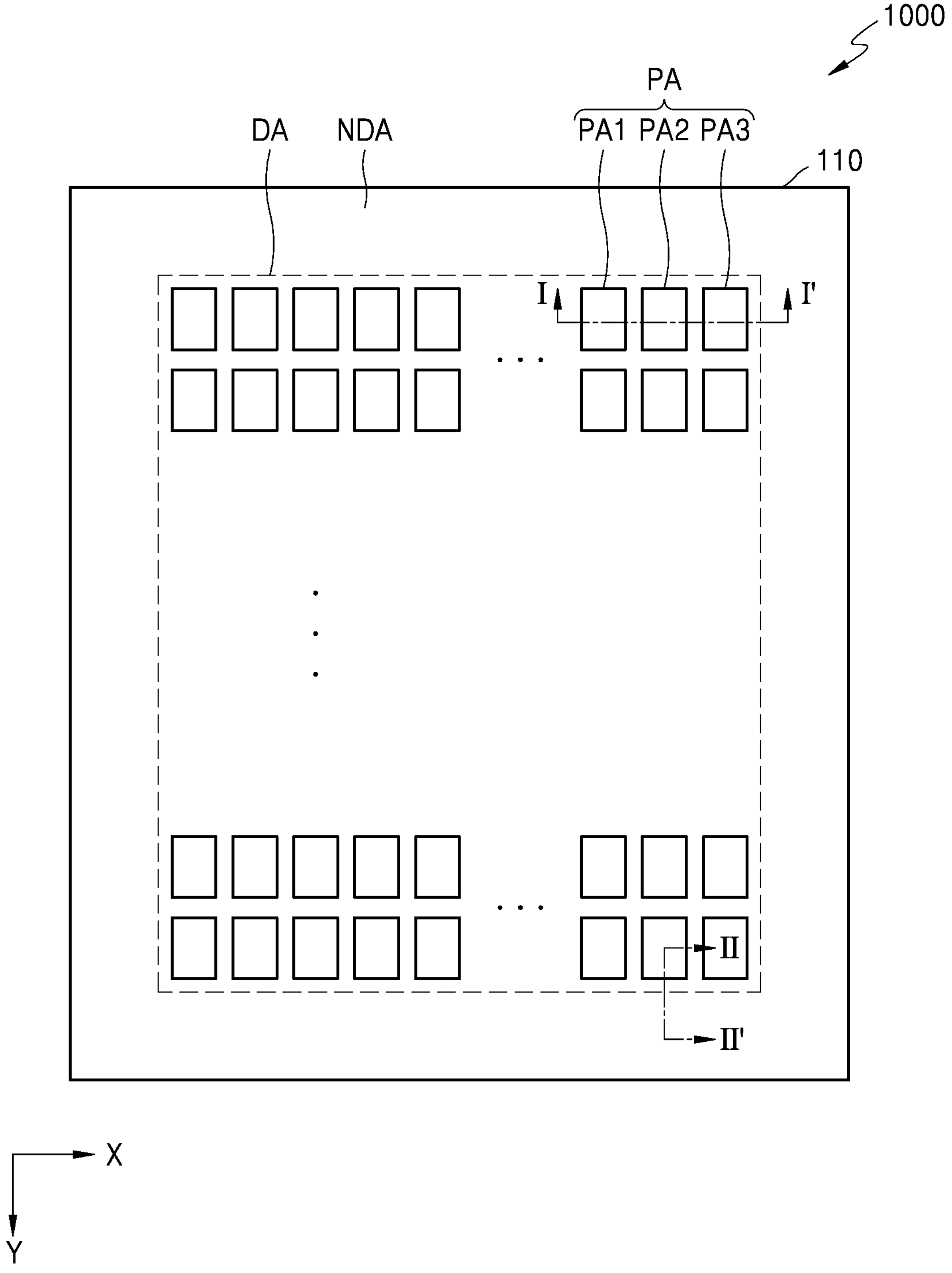
FIG. 1A is a schematic top-plan view of a display apparatus according to an embodiment.

As the present disclosure allows for various changes and numerous embodiments, particular embodiments will be illustrated in the drawings and described in more detail in the written description. Advantages and features of the present disclosure and methods of achieving the advantages and features will be described more fully with reference to the accompanying drawings, in which embodiments of the present disclosure are shown in more detail. However, the present disclosure may be embodied in many different forms and should not be construed as limited to the embodiments set forth herein.

Reference will now be made in more detail to embodiments, examples of which are illustrated in the accompanying drawings, wherein like reference numerals refer to like elements throughout, and overlapping description will be omitted.

It will be understood that although terms such as "first," "second" may be used herein to describe various components, these components are not limited by these terms, and the terms are only used to distinguish one component from one another.

As used herein, the singular forms "a," "an," and "the" are intended to include the plural forms as well, unless the context clearly indicates otherwise.

It will be further understood that the terms "includes," "including," "comprises," and/or "comprising" used herein specify the presence of stated features or components, but do not preclude the presence or addition of one or more other features or components.

In embodiments, it will be understood that when a layer, an area, or a component is referred to as being on another layer, area, or component, the layer, area, or component may be directly on the other layer, area, or component, or an intervening layer, region, or component may be present therebetween. In contrast, when a layer, an area, or a component is referred to as being "directly on" another layer, area, or component, there are no intervening elements present.

Sizes of components in the drawings may be exaggerated or reduced for convenience of explanation. In other words, since sizes and thicknesses of components in the drawings are arbitrarily illustrated for convenience of explanation, the present disclosure is not limited thereto.

When a certain embodiment may be differently implemented, a specific process order may be performed differently from the described order. For example, two consecutively described processes may be performed substantially at the same time or performed in an order opposite to the described order.

In the specification, "A and/or B" indicates A, B, or A and B. "At least one of A and B" also indicates A, B, or A and B.

In the following embodiments, when a layer, region, or component is connected to another layer, region, or component, the layer, region, or component may be directly connected to the other layer, region, or component, and may be indirectly connected to the other layer, region, or component with another layer, region, or component therebetween. For example, in the present specification, when a layer, region, or component is electrically connected to another layer, region, or component, the layer, region, or component may be electrically connected in a direct manner to the other layer, region, or component, and electrically connected in an indirect manner to the other layer, region, or component with another layer, region, or component therebetween.

In embodiments, x axis, y axis, and z axis are not limited to three axes on a rectangular coordinate system and may be interpreted to have a wider meaning. For example, the x axis, y axis, and z axis may be orthogonal to one another but may also indicate different directions that are not orthogonal to one another.

FIG. 1A is a schematic top-plan view of a display apparatus 1000 according to an embodiment.

Referring to FIG. 1A, the display apparatus 1000 according to one or more embodiments may include a display area DA, through which an image may be output, and a non-display area NDA that is an area except (that is not) the display area DA. For example, the display apparatus 1000 may provide an image to outside by using light emitted through the display area DA.

The display area DA may include a plurality of pixel areas PA, for example, a first pixel area PA1, a second pixel area PA2, and a third pixel area PA3. For example, the first pixel area PA1, the second pixel area PA2, and the third pixel area PA3 may respectively correspond to red, green, and blue pixels.

The pixel areas PA may each be systemically arranged in the display area DA. FIG. 1A shows that the pixel areas PA are arranged to construct columns and rows, but arrangement of the pixel areas PA may be variously suitably modified. For example, the pixel areas PA may be arranged in a Pentile type (e.g., a PenTile matrix).

The non-display area NDA may be provided to at least partially surround the display area DA. According to an embodiment, the non-display area NDA may be provided to entirely surround the display area DA, as shown in FIG. 1A. According to another embodiment, the non-display area NDA may also be provided to partially surround an outline of the display area DA.

FIG. 1A shows the display apparatus 1000 in which the display area DA is a rectangle, but the present disclosure is not limited thereto. For example, a shape of the display area DA may be a circle, an oval, and/or a polygon (such as a triangle and/or a pentagon). The display apparatus 1000 of FIG. 1A may be embodied (utilized) in various display apparatuses, such as a flexible display apparatus, a foldable display apparatus, and/or a rollable display apparatus.

Figure 1B:
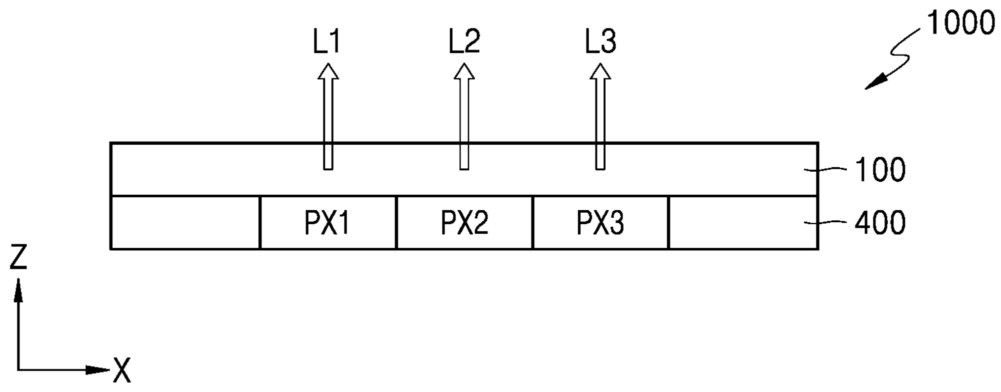
FIG. 1B is a schematic cross-sectional view of the display apparatus shown in FIG. 1A according to an embodiment.

FIG. 1B is a schematic cross-sectional view of the display apparatus 1000 shown in FIG. 1A according to an embodiment.

Referring to FIG. 1B, the display apparatus 1000 may include a display panel 400 and a color panel 100 arranged on the display panel 400.

The display panel 400 may include a plurality of pixels (for example, PX1, PX2, and PX3) emitting light based on an electrical signal. Light emitted through the display panel 400 may be irradiated toward the color panel 100, and light L1, L2, and L3 transmitted through the color panel 100 may be output to the outside.

Each pixel in the display panel 400 may include an emission element emitting light and a pixel circuit for controlling the emission element. For example, the display panel 400 may include an organic light-emitting diode (OLED) as an emission element.

Hereinafter, the display apparatus 1000 according to one or more embodiments is described as an organic light-emitting display apparatus as an example, but the present disclosure is not limited thereto. For example, the display apparatus 1000 according to one or more embodiments may be an inorganic light-emitting display that includes an inorganic light-emitting diode as an emission element, or a quantum dot light-emitting display that includes quantum dots as emission elements. For example, an emission layer of the emission element provided in the display panel 400 may include an organic material, an inorganic material, quantum dots, an organic material and quantum dots, an inorganic material and quantum dots, or at least one of each of an organic material, an inorganic material, and quantum dots. In some embodiments, the display apparatus 1000 may be a liquid crystal display device (LCD) including a backlight unit and a liquid crystal layer.

The color panel 100 may include at least one of the color filter or color conversion element in areas that overlap the pixels PX1, PX2, and PX3 of the display panel 400. For example, the light incident on the color panel 100 may be converted or transmitted and output to outside based on characteristics of at least one of the color filter or color conversion element. For example, the display apparatus 1000 may output light L1, L2, and L3 having different color characteristics according to pixels, according to characteristics of the color panel 100 overlapping each of the pixels.

Figure 2A:
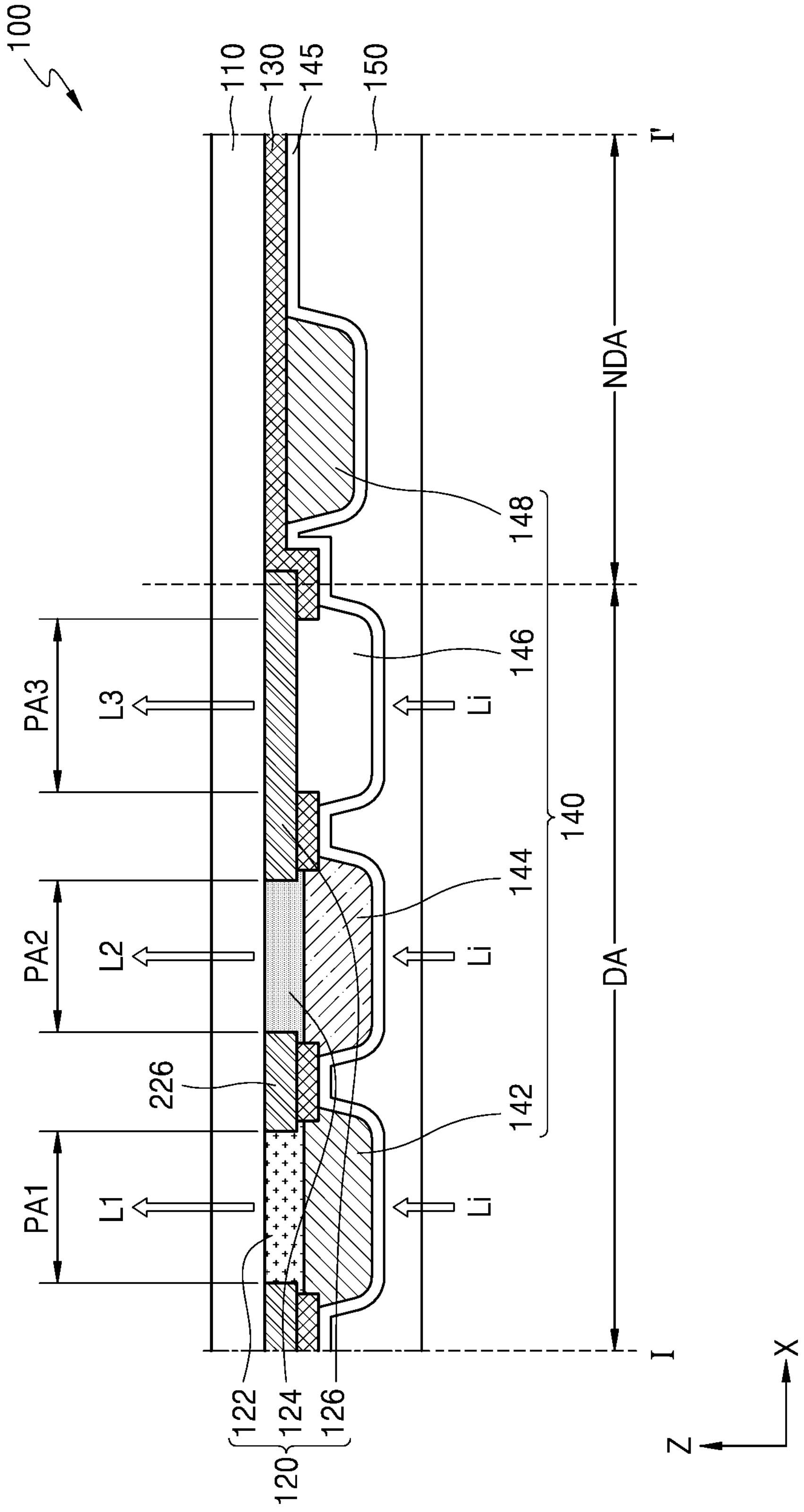
FIG. 2A is a cross-sectional view of a color panel according to an embodiment.

FIG. 2A is a cross-sectional view of the color panel according to an embodiment.

For example, FIG. 2A may be a schematic cross-sectional view of a color panel 100 when the display apparatus 1000 shown in FIG. 1A is cut along line I-I'.

Referring to FIG. 2A, the color panel 100 according to one or more embodiments may include a substrate 110, a color filter layer 120, a color conversion layer 140, and a planarization layer 150.

The substrate 110 may include a display area DA, which includes a plurality of pixel areas (for example, a first pixel area PA1, a second pixel area PA2, and a third pixel area PA3) spaced apart from one another, and a non-display area NDA that does not include a pixel area.

The color conversion layer 140 may include the color conversion elements including a plurality of quantum dots that convert light Li, which is incident on the color panel 100, into lights L1, L2, and L3 in particular (or set) wavelength bands.

The color conversion layer 140 may include a first element 142, a second element 144, a third element 146, and a dummy element 148.

For example, in the display area DA, the color conversion layer 140 may include the first element 142 that covers the first pixel area PA1, the second element 144 that covers the second pixel area PA2, and the third element that covers the third pixel area PA3.

The first element 142 may be a first color conversion element that includes first quantum dots for converting incident light Li to light L1 of a first wavelength band and outputting the converted light.

The second element 144 may be a second color conversion element that includes second quantum dots for converting the incident light Li to light L2 of a second wavelength band and outputting the converted light.

A size and structure of the first quantum dots may be different from a size and structure of the second quantum dots. For example, the first quantum dots and the second quantum dots may respectively have different particle sizes and thus emit light L1 and L2 having different color characteristics to outside. For example, the light L1 in the first wavelength band and the light L2 in the second wavelength band may each have a wavelength value greater than that of the incident light Li.

The third element 146 may be a light-transmitting element that includes light-scattering particles transmitting the incident light Li and does not include particular quantum dots. For example, a wavelength band of light output through the third element 146 may be identical to a wavelength band of the incident light Li that is incident on the third element 146.

For example, the light L1 output through the first pixel area PA1 may have a wavelength corresponding to red light, the light L2 output through the second pixel area PA2 may have a wavelength corresponding to green light, and the light L3 output through the third pixel area PA3 may have a wavelength corresponding to blue light.

The color conversion element (for example, the first color conversion element and/or the second color conversion element) may include a photosensitive polymer in which quantum dots and light-scattering particles are distributed. The quantum dots may convert the incident light Li into light of a particular wavelength band and output the converted light. The photosensitive polymer may be an organic material having light transmissivity. The light-scattering particles may scatter a portion of the incident light Li that is not absorbed by the quantum dots to allow a greater number of quantum dots to be excited, thereby increasing a color conversion rate of the color conversion element. For example, the light-scattering particles may include titanium oxide ($TiO_2$) and/or a metal particle.

A core of the quantum dot may be selected from among a Group II-VI compound, a Group III-V compound, a Group IV-VI compound, a Group IV element, a Group IV compound, and combinations thereof.

The Group II-VI compound may be selected from among: a two-element compound selected from among CdSe, CdTe, ZnS, ZnSe, ZnTe, ZnO, HgS, HgSe, HgTe, MgSe, MgS, and combinations thereof; a three-element compound selected from among CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZns, and combinations thereof; and a four-element compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and combinations thereof.

The Group III-V compound may be selected from among: a two-element compound selected from GaN, GaP, GaAs, GaSb, AlN, AlP, AlAs, AlSb, InN, InP, InAs, InSb, and combinations thereof; a three-element compound selected from among GaNP, GaNAs, GaNSb, GaPAs, GaPSb, AlNP, AlNAs, AlNSb, AlPAs, AlPSb, InNP, InNAs, InNSb, InPAs, InPSb, GaAlNP and combinations thereof; and a four-element compound selected from among GaAlNAs, GaAlNSb, GaAlPAs, GaAlPSb, GaInNP, GaInAs, GaInNSb, GaInPAs, GaInPSb, InAlNP, InAlNAs, InAlNSb, InAlPAs, InAlPSb, and combinations thereof.

The Group IV-VI compound may be selected from among: a two-element compound selected from among SnS, SnSe, SnTe, PbS, PbSe, PbTe, and combinations thereof; a three-element compound selected from SnSeS, SnSeTe, SnSTe, PbSeS, PbSeTe, PbSTe, SnPbS, SnPbSe, SnPbTe, and combinations thereof; and a four-element compound selected from among SnPbSSe, SnPbSeTe, SnPbSTe, and combinations thereof. The Group IV element may be selected from among Si, Ge, and a combination thereof. The Group IV compound may be two-element compound selected from among SiC, SiGe, and a combination thereof.

In one or more embodiments, the two-element compound, the three-element compound, and the four-element compound may each independently be in particles in uniform concentrations or be in the same particle in a state of being partially divided according to different concentrations. The quantum dot may also have a core-shell structure in which one quantum dot surrounds another quantum dot. The interface between the core and the shell may have a concentration gradient in which a concentration of an element in the shell decreases toward a center.

In some embodiments, the quantum dot may have a core-shell structure that includes a core including the above-described nanocrystal and a shell surrounding the core. The shell of the quantum dot may serve as a protective layer for preventing (or reducing) chemical change of the core, and may maintain properties of the semiconductor and/or a charging layer for giving an electrophoretic property to the quantum dot. The shell may include a single layer or a multi-layer. The interface between the core and the shell may have a concentration gradient in which a concentration of an element in the shell decreases toward a center. The shell in the quantum dot may include, for example, an oxide of a metal or a non-metal, a semiconductor compound, a combination thereof, and/or the like.

For example, the oxide of metal or a non-metal may include a two-element compound such as $SiO_2$, $Al_2O_3$, $TiO_2$, ZnO, MnO, $Mn_2O_3$, CuO, FeO, $Fe_2O_3$, $Fe_3O_4$, CoO, $Co_3O_4$, and/or NiO, and/or a three-element compound such as $MgAl_2O_4$, $CoFe_2O_4$, $NiFe_2O_4$, and/or $CoMn_2O_4$, but the present embodiment is not limited thereto.

The semiconductor compound may include, for example, Cds, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but the present embodiment is not limited thereto.

The quantum dot may have a full width of half maximum (FWHM) of about 45 nm or less, for example, about 40 nm or less, or about 30 nm or less, and color purity or color gamut may be enhanced in the above-mentioned range. In addition, as light emitted from the quantum dot is irradiated in all directions, field angle of light may widen.

A shape of the quantum dot may be any suitable shape used in the technical field and is not particularly limited. For example, the shape of the quantum dot may include a sphere, a pyramid shape, a multi-arm shaped and/or a cubic-shaped nano particle, nano tube, nano wire, nano fabric, nano laminar particle, and/or the like.

Colors of emitted light may be adjusted according to sizes of particles of quantum dots, and thus, the quantum dots may have various suitable emission colors such as blue, red, and green.

The color conversion layer 140 may include at least one dummy element 148 located in the non-display area NDA. The dummy element 148 may be arranged apart from the display area DA. In some embodiments, the dummy element 148, the first element 142, the second element 144, and the third element 146 may be arranged apart from one another.

The dummy element 148 may include the same material as one of elements (for example, the first element 142, the second element 144, and/or the third element 146) of the color conversion layer 140 provided in the display area DA. For example, the dummy element 148 may include the same material as any one of the first color conversion element, the second color conversion element, and/or the light-transmitting element.

In an example, the dummy element 148 may include a photosensitive polymer, in which quantum dots (for example, any one of the first quantum dots and the second quantum dots) and the light-scattering particles are distributed. In another example, the dummy element 148 may include a photosensitive polymer, in which light-scattering particles are distributed, but may not include quantum dots.

For example, the dummy element 148 may include the same material as a particular element (for example, the first element 142, the second element 144, and/or the third element 146) covering the pixel areas PA, based on arrangement rules of the pixel areas PA in the display area DA. According to an embodiment, when pixel areas PA corresponding to red, green, and blue colors are alternatively arranged in the display area DA, and a pixel area corresponding to blue color is arranged at an end portion of the display area DA, the dummy element 148 of the non-display area NDA adjacent to the pixel area PA corresponding to blue color may include the same material as an element covering a pixel area PA corresponding to red color.

According to one or more embodiments of the present disclosure, by including the dummy element 148 arranged in the non-display area NDA, the color panel 100 may prevent (or reduce) deterioration of each element (for example, the third element 146 adjacent to the dummy element 148) of the color conversion layer 140 covering the pixel area PA, and may minimize (or reduce) stains caused due to the elements in the display area DA.

In a related art color panel that does not include the dummy element (e.g., the dummy element 148 shown in FIG. 2A), in the forming of the conversion layer of the color panel, a profile of an element arranged at an edge of the display area (for example, where the third element 146 shown in FIG. 2A is arranged) may have a different form than a profile of an element arranged in a center portion of the display area (for example, where the first element 142 and/or the second element 144 shown in FIG. 2A are arranged). In this case, defects may occur during a process of forming a capping layer on the color conversion layer and cause deterioration of components provided in the color panel. According to one or more embodiments of the present disclosure, the color panel 100 may include the dummy element 148 to improve reliability problems due to the deterioration stated above.

The light-shielding member 130 may be located in correspondence (to correspond) to an area between each of the pixel areas (for example, PA1, PA2, and PA3) of the display area DA and the non-display area NDA. The light-shielding member 130 may be interposed between the substrate 110 and the color conversion layer 140. The light-shielding member 130 may include, for example, a black matrix, a black pigment, a metal material, and/or the like. In some embodiments, the light-shielding member 130 may include a material having a reflective characteristic.

The color filter layer 120 may be interposed between the substrate 110 and the color conversion layer 140 and may include color filters 122, 124, and 126 that selectively transmit light of a particular wavelength band. The color filters 122, 124, and 126 may be located in correspondence (to correspond) to the plurality of pixel areas PA (for example, PA1, PA2, and PA3) provided in the display area DA. For example, as shown in FIG. 2A, the color filters 122, 124, and 126 respectively located in correspondence to the plurality of pixel areas PA1, PA2, and PA3 may be spaced apart from one another with the light-shielding member 130 therebetween.

The color filter layer 120 may include a first color filter 122 that covers the first pixel area PA1, a second color filter 142 that covers the second pixel area PA2, and a third color filter 126 that covers the third pixel area PA3.

For example, the first color filter 122 may selectively transmit the light of the first wavelength band, the second color filter 124 may selectively transmit the light of the second wavelength band, and the third color filter 126 may selectively transmit the light of the third wavelength band. The light of the first wavelength band may correspond to red light, the light of the second wavelength band may correspond to green light, and the light of the third wavelength band may correspond to blue light.

According to an embodiment, the color panel 100 may further include a light-shielding color filter 226. The light-shielding color filter 226 may be arranged between the plurality of pixel areas. For example, the light-shielding color filter 226 may be arranged between the first pixel area PA1 and the second pixel area PA2 as shown in FIG. 2A. The first color filter 122 and the second color filter 124 may be spaced apart from each other by the light-shielding color filter 226 and the light-shielding member 130 stacked on the light-shielding color filter 226. The light-shielding color filter 226 may serve as an auxiliary light-shielding element such that light is not emitted from an area between the first pixel area PA1 and the second pixel area PA2. The light-shielding color filter 226 may include the same material as the third color filter 126.

According to one or more embodiments, in the color panel 100, a portion of the first color filter 122 and a portion of the second color filter 124 may be arranged with (e.g., side-contacting) the light-shielding member 130. In addition, a portion of the light-shielding member 130 may be arranged on the third color filter 126. In other words, a portion of the third color filter 126 may be located between the substrate 110 and the light-shielding member 130 (in the thickness direction or z-axis direction).

The capping layer 145 and the planarization layer 150 may be arranged to cover each element of the color conversion layer 140.

The capping layer 145 may include a transmissive inorganic insulating material. For example, the capping layer 145 may include a material such as silicon oxide ($SiO_x$), silicon nitride ($SiN_x$), and/or silicon oxynitride (SiON).

The planarization layer 150 may planarize a surface of the substrate 110 on which the color conversion layer 140 is arranged. The planarization layer 150 may include a transparent material such that the incident light Li is irradiated toward the color conversion layer 140. For example, the planarization layer 150 may include a transparent organic material such as a polyimide resin, an acryl resin, and/or a resist material. The planarization layer 150 may be formed by a wet process (such as a slit coating method and/or a spin coating method), and/or a dry process (such as a chemical vapor deposition method and/or a vacuum deposition method). However, embodiments of the present disclosure are not limited to materials and forms stated above.

Figure 2B:
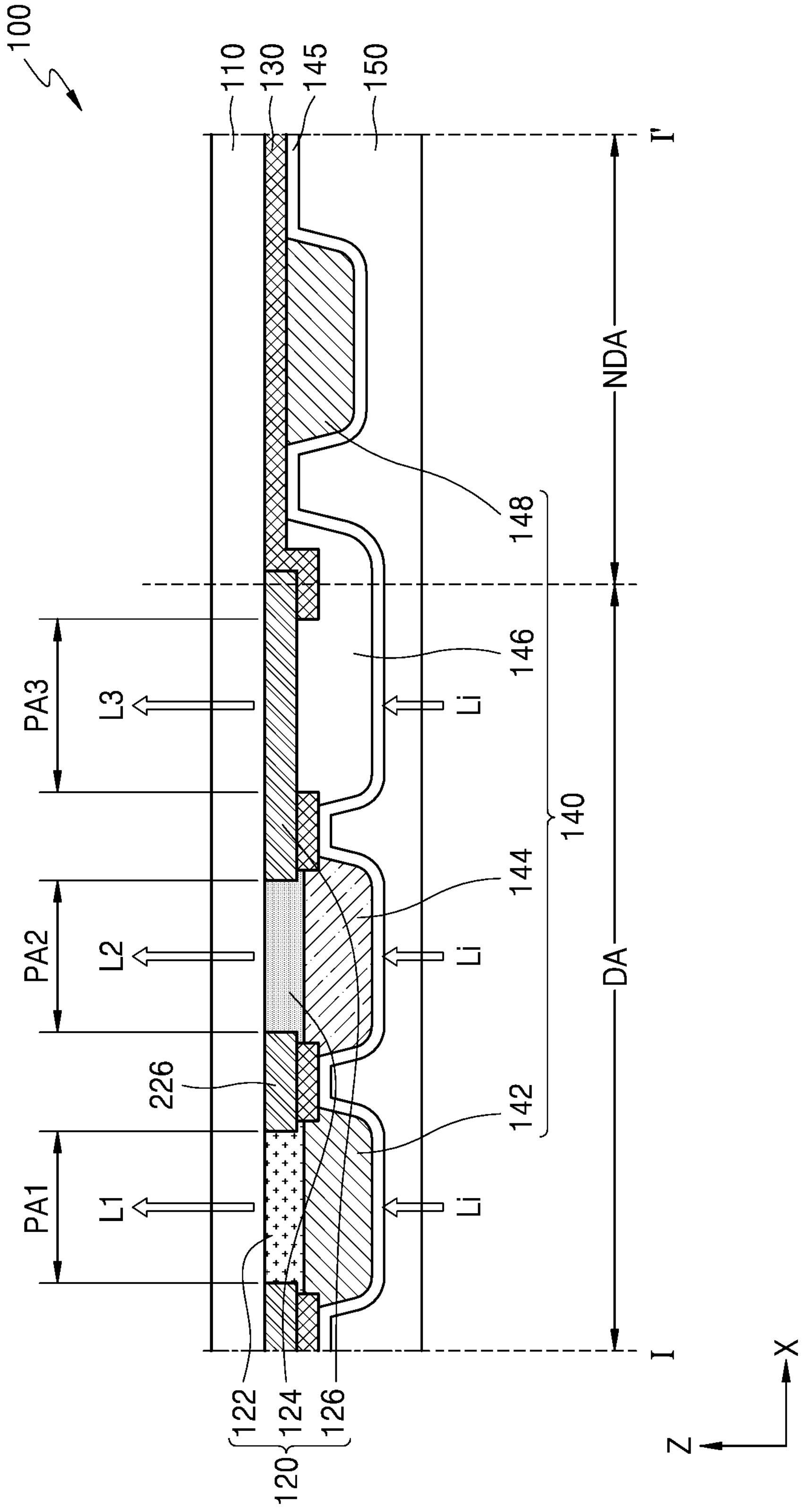
FIG. 2B is a cross-sectional view of a color panel according to an embodiment.

FIG. 2B is a cross-sectional view of the color panel 100 according to another embodiment. For example, FIG. 2B may be a cross-sectional view of the color panel 100 when the display apparatus 1000 shown in FIG. 1 is taken (cut) along line I-I'.

According to one or more embodiments, at least one element covering a particular pixel area adjacent to the non-display area NDA may extend from the display area DA toward the non-display area NDA to cover a portion of the non-display area NDA.

For example, as shown in FIG. 2B, the third element 146 that covers the third pixel area PA3 may include a portion located in the display area DA and a portion located in the non-display area NDA. The portion of the third element 146 located in the display area DA may be integral with the portion of the third element 146 located in the non-display area NDA. In other words, the third element 146 may be arranged to extend from a portion of the display area DA to the non-display area NDA.

As shown in FIG. 2B, the color panel 100 may further include the dummy element 148 that is apart from the third element 146 and arranged in the non-display area NDA. Description of the dummy element 148 may be the same as the one provided with reference to FIG. 2A.

According to another embodiment, the color panel 100 may not include the dummy material 148.

Figure 2C:
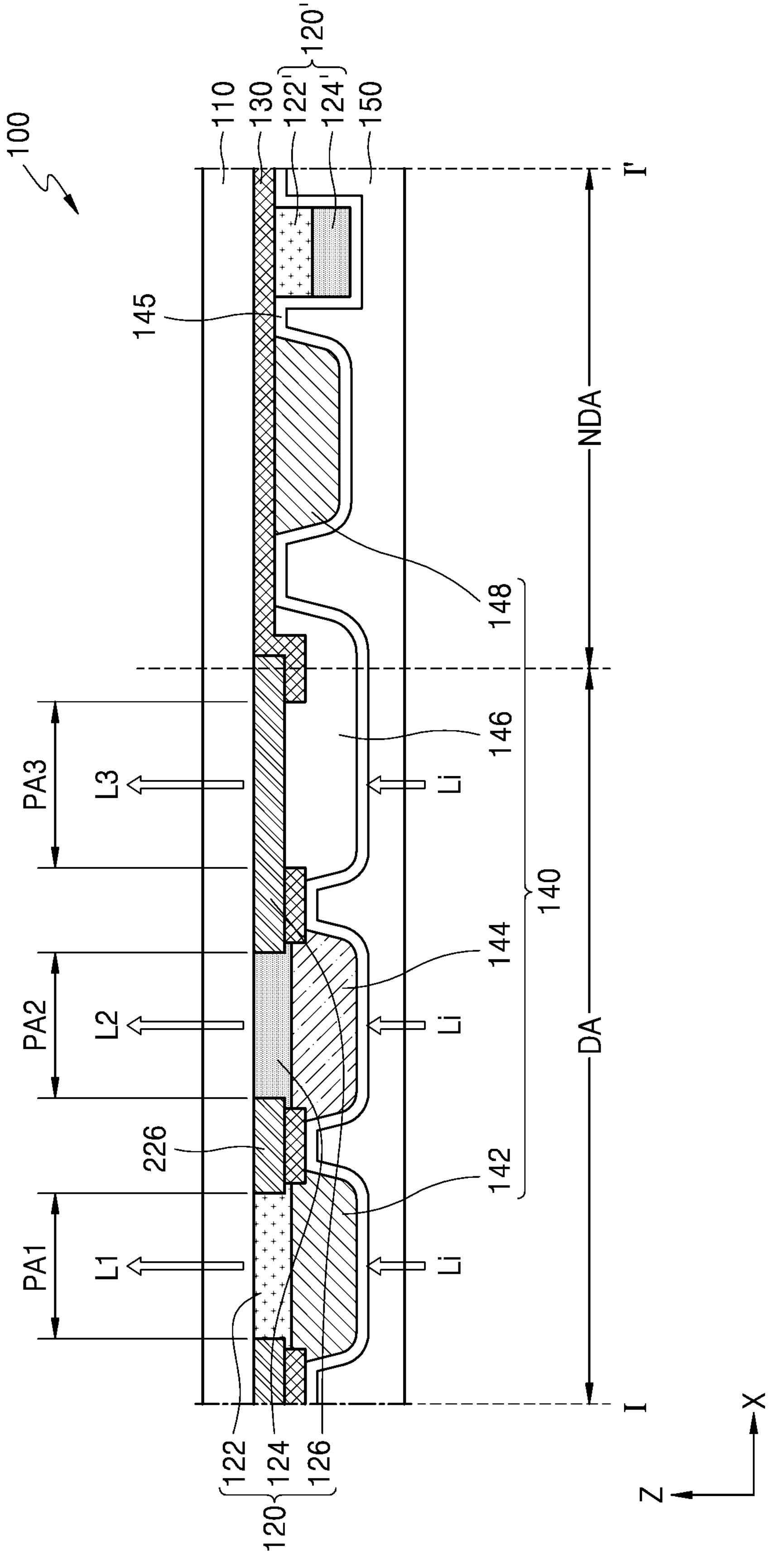
FIG. 2C is a cross-sectional view of a color panel according to an embodiment.

FIG. 2C is a cross-sectional view of the color panel 100 according to another embodiment. For example, FIG. 2C may be a cross-sectional view of the color panel 100 when the display apparatus 1000 shown in FIG. 1 is taken (cut) along line I-I'.

Referring to FIG. 2C, the color panel 100 according to an embodiment may further include a dummy color filter 120'.

The dummy color filter 120' may be arranged apart from the dummy element 148 (for example, the dummy element 148 shown in FIG. 2A) in a portion of the non-display area NDA. In other words, the dummy element 148 may be arranged between the third element 146 and the dummy color filter 120'.

The dummy color filter 120' may include the same material as at least one selected from the color filters 122, 124, and 126 included in the color filter layer 120 (and the plurality of elements 142, 144, and 146).

For example, the dummy color filter 120' may include a double-layer structure in which a first dummy color filter 122' including the same material as the first color filter 122 and a second dummy color filter 124' including the same material as the second color filter 124 are stacked.

In some embodiments, the dummy color filter 120' may include a single layer structure including any one of the first dummy color filter 122' or the second dummy color filter 124'.

The color panel 100 may include the dummy element 148 arranged in the non-display area NDA. Description of the dummy element 148 may be the same as the one provided with reference to FIG. 2A.

The dummy element 148 and the dummy color filter 120' may be arranged in the non-display area NDA apart from the display area DA, but arrangement order is not limited to the structure shown in FIG. 2C. For example, the dummy element 148 may be arranged between the third element 146 and the dummy color filter 120' in the non-display area NDA (in the x-axis direction). In some embodiments, the dummy element 148 may be arranged to overlap the dummy color filter 120' (in the z-axis direction).

According to one or more embodiments, the color panel 100 is not limited to the structures shown in FIGS. 2A to 2C and may have structures of various suitable combinations.

For example, the color panel 100 may have a structure as that of the color panel 100 shown in FIG. 2C, without the dummy element 148. As another example, the color panel 100 may have a structure as that of the color panel 100 shown in FIG. 2A, wherein the dummy color filter 120' that is apart from the dummy element 148 and arranged in the non-display area NDA is further included in the structure. In some embodiments, the color panel 100 may have a structure as that of the color panel 100 shown in FIG. 2A, wherein the dummy color filter 120' is arranged instead of the dummy element 148 in the structure.

FIGS. 3A through 3D are cross-sectional views of the color panel 100 according to one or more embodiments of the present disclosure. For example, FIGS. 3A to 3D may be cross-sectional views of the color panel 100 when the display apparatus 1000 shown in FIG. 1 is cut along line II-II'.

Figure 3A:
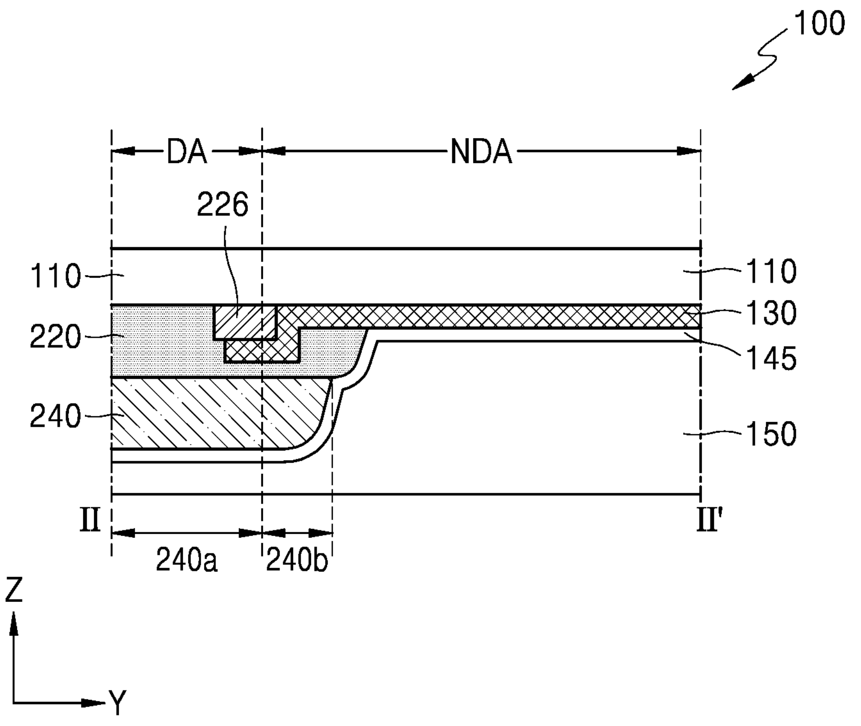
FIG. 3A is a cross-sectional view of a color panel according to one or more embodiments of the present disclosure.

Referring to FIG. 3A, the color panel 100 may include the substrate 110, a color filter 220, and an element 240.

The substrate 110 may include the display area DA and the non-display area NDA. The color panel 100 may further include the light-shielding member 130 that is interposed between the substrate 110 and the color filter 220 and arranged in correspondence (to correspond) to the non-display area NDA. In addition, the color panel 100 may further include the light-shielding color filter 226 that is interposed between the substrate 110 and the light-shielding member 130 and serves as the auxiliary light-shielding element in an area. The light-shielding color filter 226 may include a material that may selectively transmit the light of the third wavelength band, and may cover at least a portion of the pixel areas PA included in the display area DA. For example, the portion of the pixel areas PA covered by the light-shielding color filter 226 may correspond to the pixel area emitting blue light.

As shown in FIG. 3A, the color filter 220 may extend from the display area DA to the non-display area NDA to cover a portion of the non-display area NDA. For example, the color filter 220 may include a portion located in the display area DA and a portion located in the non-display area NDA, and the portion located in the display area DA and the portion located in the non-display area NDA may be integral with each other. The color filter 220 may include the same material as any one of the first color filter (for example, the first color filter 122 shown in FIG. 2A) that may selectively transmit the light of the first wavelength band or the second color filter (for example, the second color filter 124) that may selectively transmit the light of the second wavelength band.

The color filter 220 may cover a portion of pixel areas PA in the display area DA. For example, the portion of pixel areas PA covered by the color filter 220 may correspond to a pixel area emitting red light and/or green light.

The element 240 may be interposed between the color filter 220 and the planarization layer 150. The element 240 may include a first portion 240*a* located in the display area DA. In addition, the element 240 may include a second portion 240*b* that is integral with the first portion 240*a* and is located in the non-display area NDA. The element 240 may be arranged on the color filter 220 in correspondence (to correspond) to at least a portion of an area in which the color filter 220 is formed.

The element 240 may include the same material as the first color conversion element (that converts the incident light into the light of the first wavelength band and outputs the converted light) or the second color conversion elements (that converts the incident light into the light of the second wavelength band and outputs the converted light).

Figure 3B:
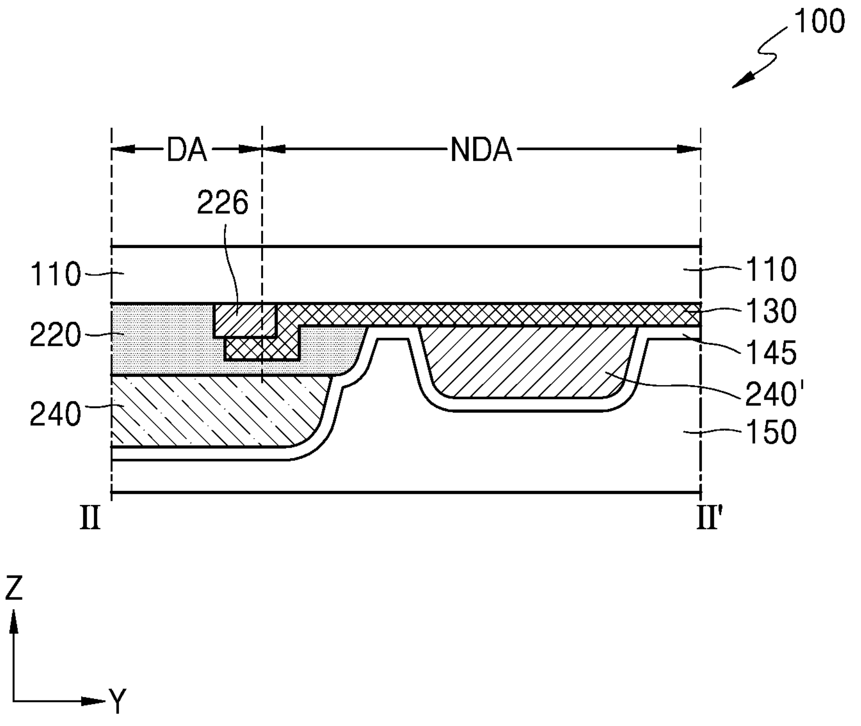
FIG. 3B is a cross-sectional view of a color panel according to one or more embodiments of the present disclosure.

Referring to FIG. 3B, the color panel 100 may further include a dummy element 240' interposed between the light-shielding member 130 and the planarization layer 150.

The dummy element 240' may be located in the non-display area NDA and arranged apart from the element 240 by a distance. For example, the dummy element 240' may be arranged at a distance of about 5 um to about 15 um from the element 240.

The dummy element 240' may include the same material as the element 240. For example, the dummy element 240' may include the same material as the first color conversion element or the second color conversion element on the display area DA.

Figure 3C:
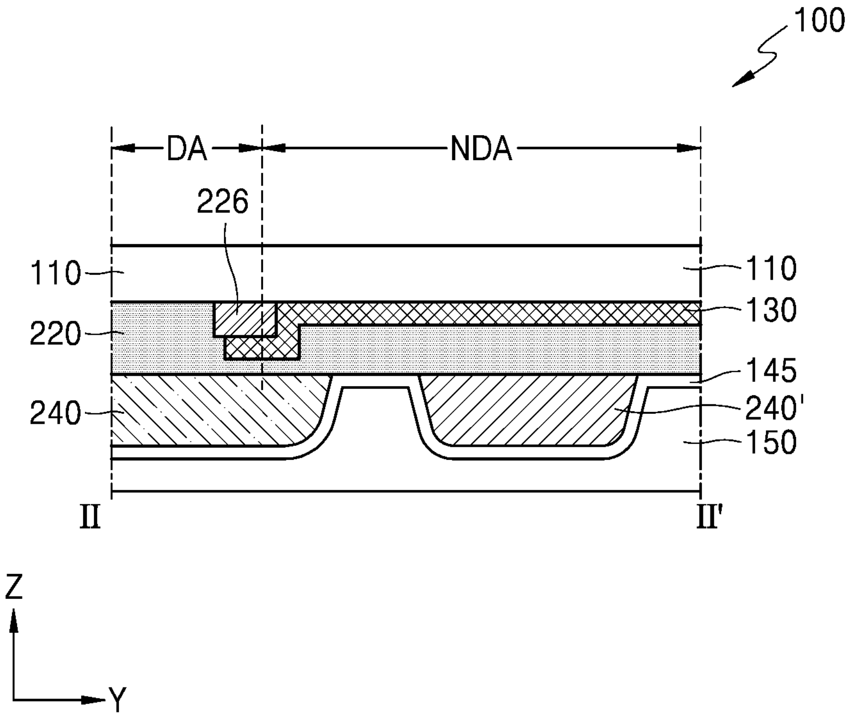
FIG. 3C is a cross-sectional view of a color panel according to one or more embodiments of the present disclosure.

Referring to FIG. 3C, the dummy element 240' may be interposed between the color filter 220, which extends to the non-display area NDA, and the planarization layer 150.

The dummy element 240' according to various embodiments of the present disclosure may be arranged in a portion of the non-display area NDA in which the color filter 220 is not formed, as shown in FIG. 3B, or arranged in a portion of the non-display area NDA in which the color filter 220 is formed, as shown in FIG. 3C.

Figure 3D:
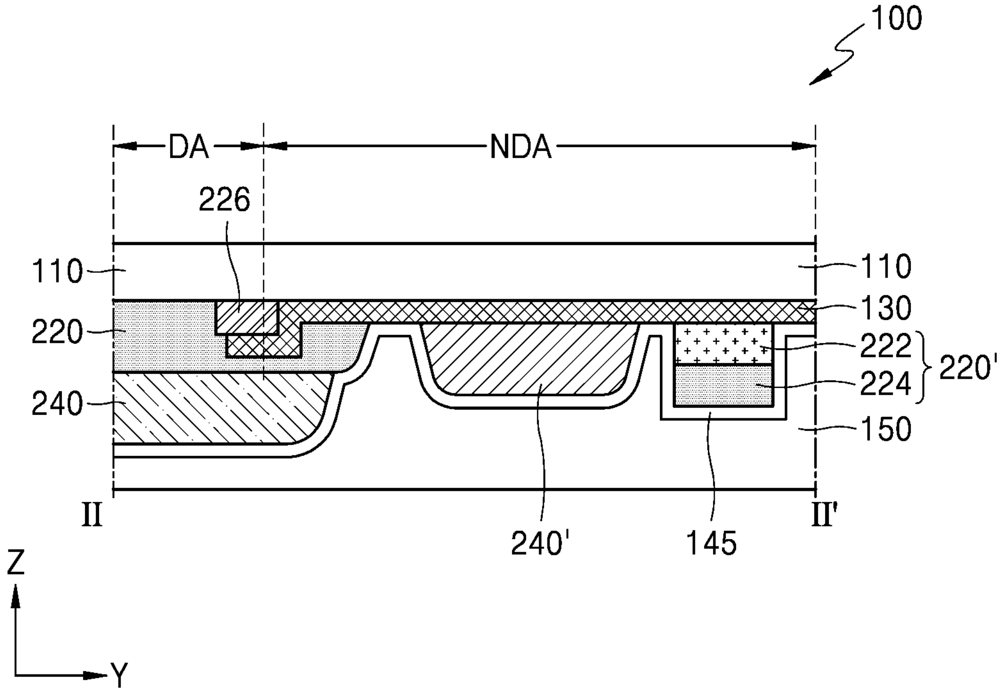
FIG. 3D is a cross-sectional view of a color panel according to one or more embodiments of the present disclosure.

Referring to FIG. 3D, the color panel 100 may further include a dummy color filter 220' interposed between the light-shielding member 130 and the planarization layer 150.

The dummy color filter 220' may be interposed between the light-shielding member 130 and the planarization layer 150 in the non-display area NDA. The dummy color filter 220' may be arranged apart from each of the element 240 and the dummy element 240'. As shown in FIG. 3D, the dummy element 240' may be arranged between the element 240 and the dummy color filter 220'.

In another embodiment, the dummy color filter 220' may be further provided between the color filter 220 and the planarization layer 150 in the color panel 100 shown in FIG. 3C. For example, the dummy color filter 220' may be arranged apart from the dummy element 240'. The dummy element 240' may be arranged between the element 240 and the dummy color filter 220'.

The dummy color filter 220' may include at least one of the first color filter (that selectively transmits the light of the first wavelength band) or the second color filter (that selectively transmits the light of the second wavelength band). For example, the dummy color filter 220' may include a single layer structure including the same material as any one of the first color filter or the second color filter, or may include a double-layer structure including the same material as the first color filter and/or the second color filter. For example, the dummy color filter 220' may include the same material as the color filter 220.

Figure 4:
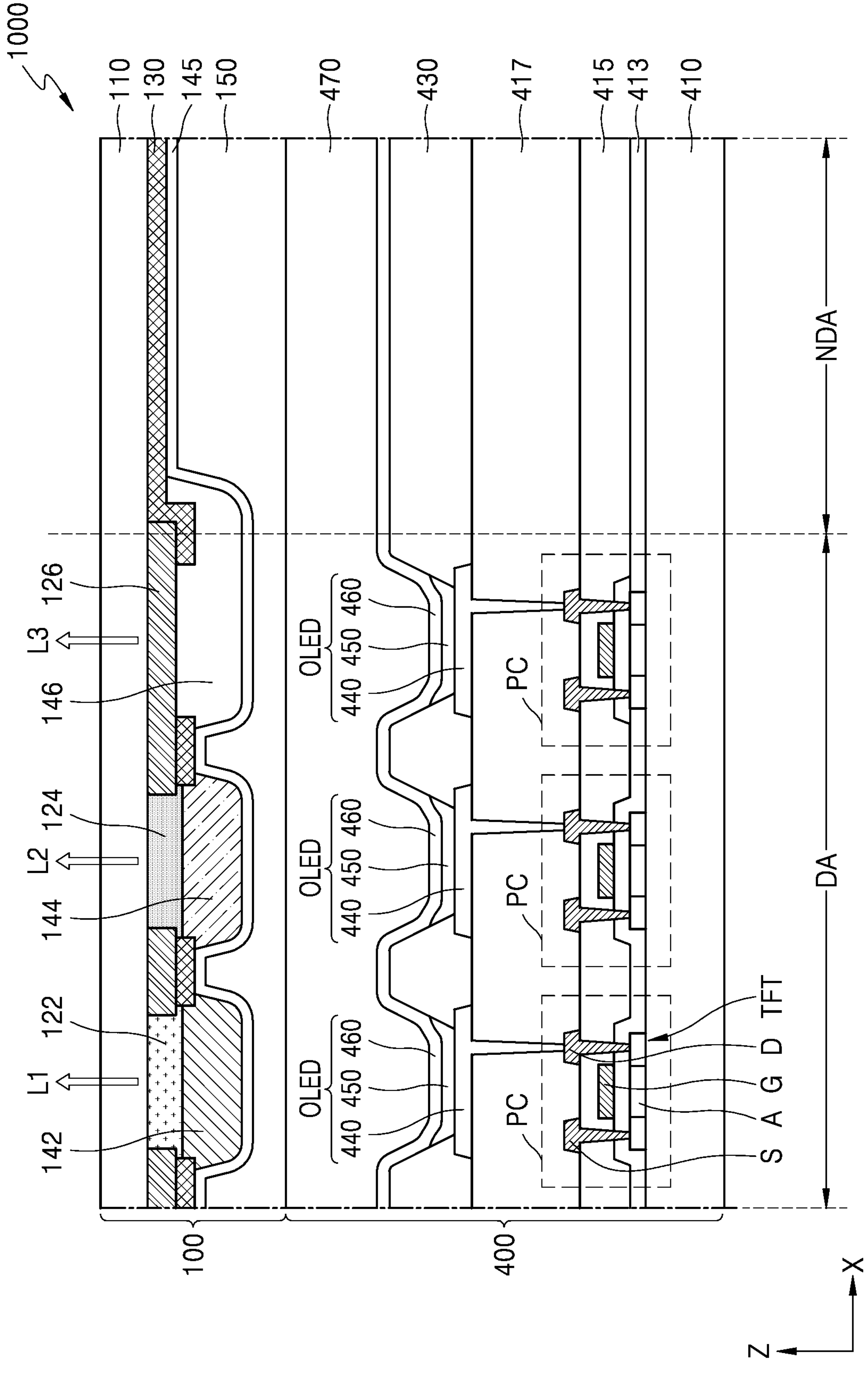
FIG. 4 is a cross-sectional view of a display apparatus according to an embodiment.

FIG. 4 is a cross-sectional view of the display apparatus 1000 according to an embodiment. FIG. 4 may be a cross-sectional view of the display apparatus 1000 when the display apparatus 1000 of FIG. 1 is cut along line II-II'.

Referring to FIG. 4, the display apparatus 1000 may include the display panel 400 and the color panel 100 arranged on the display panel 400.

The display panel 400 may include a lower substrate 410 and a plurality of pixels arranged on the lower substrate 410. The plurality of pixels may each include a pixel circuit PC, including a thin-film transistor, and an emission element (for example, an organic light-emitting diode OLED) electrically connected to the pixel circuit PC.

The lower substrate 410 may include glass and/or a polymer resin. The polymer resin may include polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose acetate propionate (CAP), and/or the like. For example, the substrate 410 including the above-stated polymer resin may be flexible, rollable, and/or bendable. The substrate 410 may have a multi-layer structure including a layer, which includes the above-stated polymer resin, and an inorganic layer. For example, the substrate 410 may include a multi-layer structure including a first polymer resin layer and a second polymer resin layer. An inorganic layer may be interposed between the first polymer resin layer and the second polymer resin layer.

A semiconductor layer A may include amorphous silicon. In some embodiments, the semiconductor layer A may include an oxide semiconductor including indium (In), gallium (Ga), stannum (Sn), zirconium (Zr), vanadium (V), hafnium (Hf), cadmium (Cd), germanium (Ge), chromium (Cr), titanium (Ti), and/or zinc (Zn). For example, the semiconductor layer A may include an oxide semiconductor such as indium gallium zinc oxide (IGZO), zinc tin oxide (ZTO), and/or zinc indium oxide (ZIO).

A gate electrode G is arranged above the semiconductor layer A with a gate insulating layer 413 therebetween. The gate electrode G may include molybdenum (Mo), aluminum (Al), copper (Cu), titanium (Ti), and/or the like, and may include a single layer or a multi-layer. For example, the gate electrode G may be a single Mo layer.

The gate insulating layer 413 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like.

A source electrode S and/or a drain electrode D may be arranged above the gate electrode G with an interlayer insulating layer 415 therebetween. The source electrode S and/or the drain electrode D may include Mo, Al, Cu, Ti, and/or the like, and may include a single layer or a multi-layer. For example, the source electrode S and/or drain electrode D may have a Ti/Al/Ti multi-layer structure.

A lower planarization layer 417 may cover an upper surface of the source electrode S and/or the drain electrode D and may have an even (or substantially even) upper surface such that a pixel electrode 440 may be formed evenly. The lower planarization layer 417 may include a single layer or a multi-layer including an organic material. The lower planarization layer 417 may include a commercial polymer (like benzocyclobutene (BCB), polyimide, hexamethyldisiloxane (HMDSO), polymethylmethacrylate (PMMA), and/or polystyrene (PS)), a polymer derivative having a phenolic group, an acryl-based polymer, an imide-based polymer, an acrylether-based polymer, an amide-based polymer, a fluoride-based polymer, a p-xylene-based polymer, a vinylalcohol-based polymer, a blend thereof, and/or the like. The planarization layer 417 may include an inorganic material. The lower planarization layer 417 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like. When the lower planarization layer 417 includes an inorganic material, chemical planarization polishing may be performed depending on occasions. In some embodiments, the lower planarization layer 417 may include both an organic material and an inorganic material.

A pixel electrode 440 may include a (semi)transmissive electrode or a reflective electrode. In some embodiments, the pixel electrode 440 may include a reflective film including silver (Ag), magnesium (Mg), Al, platinum (Pt), palladium (Pd), gold (Au), nickel (Ni), neodymium (Nd), iridium (Ir), Cr, a combination thereof, and/or the like, and a transparent or semi-transparent electrode formed on the reflective film. The transparent or semi-transparent electrode layer may include at least one material selected from among indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 440 may include an ITO/Ag/ITO stack structure.

A pixel defining layer 430 may be arranged on the lower planarization layer 417. The pixel defining layer 430 may define an emission area of each pixel by having an opening that exposes a center portion of the pixel electrode 440. In addition, the pixel defining layer 430 may increase distances between edges of the pixel electrode and the opposite electrode 460, above the pixel electrode 440, thereby preventing (or reducing) an arc and/or the like from occurring at the edges of the pixel electrode 440. The pixel defining layer 430 may be formed of an organic insulating material such as polyimide, polyamide, an acryl resin, benzocyclobutene, hexamethyldisiloxane (HMDSO), a phenol resin and/or the like in a method such as a spin coating method, without limitation.

An intermediate layer 450 of an organic light-emitting diode OLED may include an organic emission layer. The organic emission layer may include an organic material that includes a fluorescent and/or phosphorescent material emitting red, green, blue, and/or white light. The organic emission layer may include a low molecular weight material or a high molecular weight material. A functional layer such as a hole transport layer (HTL), a hole injection layer (HIL), an electron transport layer (ETL), an electron injection layer (HIL), and/or the like may be selectively further arranged under and above the organic emission layer. The intermediate layer 450 may be arranged in correspondence (to correspond) to each of the plurality of pixel electrodes 440. However, the intermediate layer 450 is not limited thereto. The intermediate layer 450 may be variously suitably modified, for example, to include a layer that is integral over the plurality of pixel electrodes 440.

The opposite electrode 460 may be a transmissive electrode or a reflective electrode. In some embodiments, the opposite electrode 460 may be a transparent or a semi-transparent electrode and may include a metal thin-film that has a small work function, the metal thin-film including Li, Ca, LiF/Ca, LiF/Al, Al, Ag, Mg, and/or a combination thereof. In some embodiments, a transparent conductive oxide (TCO) film such as ITO, IZO, ZnO, and/or $In_2O_3$ may be further arranged on the metal thin-film. The opposite electrode 460 may be arranged over the display area DA and the non-display area NDA, and may be arranged on the intermediate layer 450 and the pixel defining layer 430. The opposite electrode 460 may be integrally formed over the plurality of emission elements OLED.

The thin-film encapsulation layer 470, which is a sealing member for sealing the emission elements OLED, may include at least one inorganic encapsulation layer and at least one organic encapsulation layer. The at least one inorganic encapsulation layer may include at least one inorganic insulating material selected from among aluminum oxide, titanium oxide, tantalum oxide, hafnium oxide, zinc oxide, silicon oxide, silicon nitride, and silicon oxynitride. The organic encapsulation layer may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, an acryl-based resin (for example, polymethylmethacrylate, polyacrylic acid, and/or the like), and/or any combination thereof.

The color panel 100 may have a plurality of pixel areas arranged on the display panel 400 and respectively overlapping the plurality of emission elements OLED. For example, in the display apparatus 1000, light emitted from each pixel of the display panel 400 may be incident on the color panel 100, and a wavelength band of the incident light may be converted in the color panel 100, or only a particular wavelength band of the incident light may be transmitted, or the incident light may be scattered and output toward a pixel area at an upper portion of the color panel 100. Light incident through the display panel 400 according to an embodiment may correspond to blue light.

The color panel 100 in FIG. 4 may be identical to (or substantially the same as) any one of the structures described above with reference to FIGS. 2A through 3D.

According to an embodiment, the color panel 100 may include the color conversion layer 140 that is interposed between the color filter layer 120 (in which the color filters 122, 124, and 126 are arranged) and the display panel 400, the color conversion layer 140 including the first color conversion element (for example, the first element 142) that converts the light incident on the color panel 100 into light of a particular wavelength band and outputs the converted light, and the second color conversion element (for example, the second element 144) separated from the first color conversion element.

The color panel 100 may include the element (for example, the third element 146) that is interposed between the color filter layer 120 and the display panel 400 and integrally covering a portion of the display area DA and a portion of the non-display area NDA. The element may cover a pixel area PA located at the end portion of the display area DA and extend to a portion of the non-display area NDA. The element (for example, the third element 146) may include the same material (e.g., may be the same in material) as the first color conversion element (for example, the first element 142) or the second color conversion element (for example, the second element 144) located in the display area DA, or may include the same material (e.g., may be the same in material) as the light-transmitting element that is located in the display area DA and that transmits the incident light without converting the wavelength band.

Figure 5:
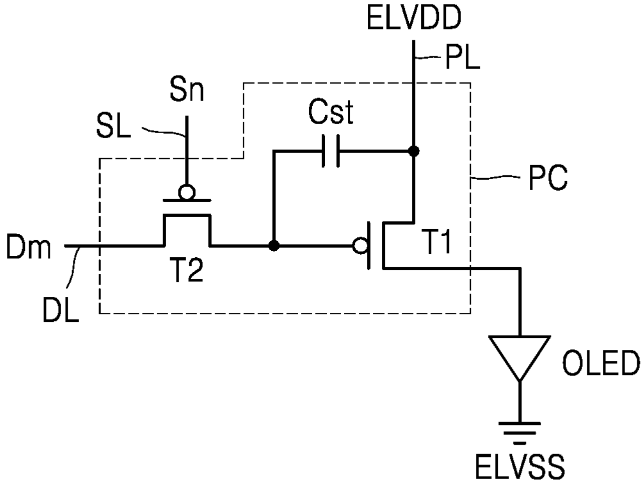
FIG. 5 is an equivalent circuit diagram of a pixel circuit included in a display apparatus according to an embodiment.

FIG. 5 is an equivalent circuit diagram of the pixel circuit PC included in the display apparatus 1000 according to an embodiment.

The pixel circuit PC may include a driving thin-film transistor T1, a switching thin-film transistor T2, and a storage capacitor Cst. The switching thin-film transistor T2 is connected to a scanning line SL and a data line DL and transmits a data signal Dm, which is input through the data line DL, to the driving thin-film transistor T1, in response to a scanning signal Sn input through the scanning line SL.

The storage capacitor Cst is connected to the switching thin-film transistor T2 and a driving voltage line PL, and stores a voltage corresponding to a difference between a voltage received from the switching thin-film transistor T2 and a first power voltage (ELVDD or the driving voltage) provided to the driving voltage line PL.

The driving thin-film transistor T1 may be connected to the driving voltage line PL and the storage capacitor Cst, and may control a driving current flowing from the driving voltage line PL to the organic light-emitting diode OLED in correspondence to a value of the voltage stored in the storage capacitor Cst. The organic light-emitting diode OLED may emit light having a certain luminance according to the driving current.

FIG. 5 shows a case in which the pixel circuit PC includes two thin-film transistors and one storage capacitor, but the present disclosure is not limited thereto. The pixel circuit PC may include seven thin-film transistors and one storage capacitor, for example.

Figure 6A:
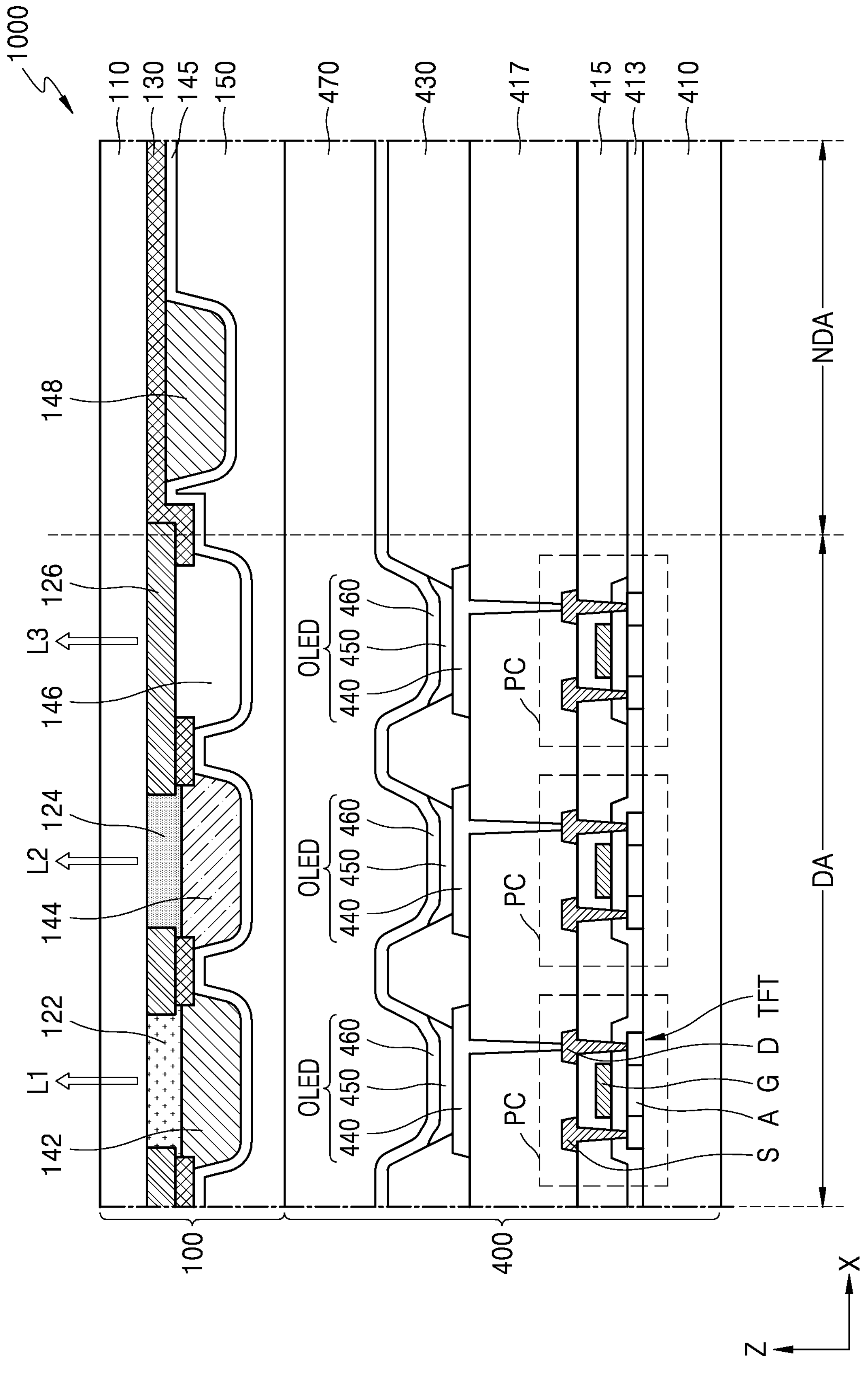
FIG. 6A is a cross-sectional view of a display apparatus according to one or more embodiments of the present disclosure.
Figure 6B:
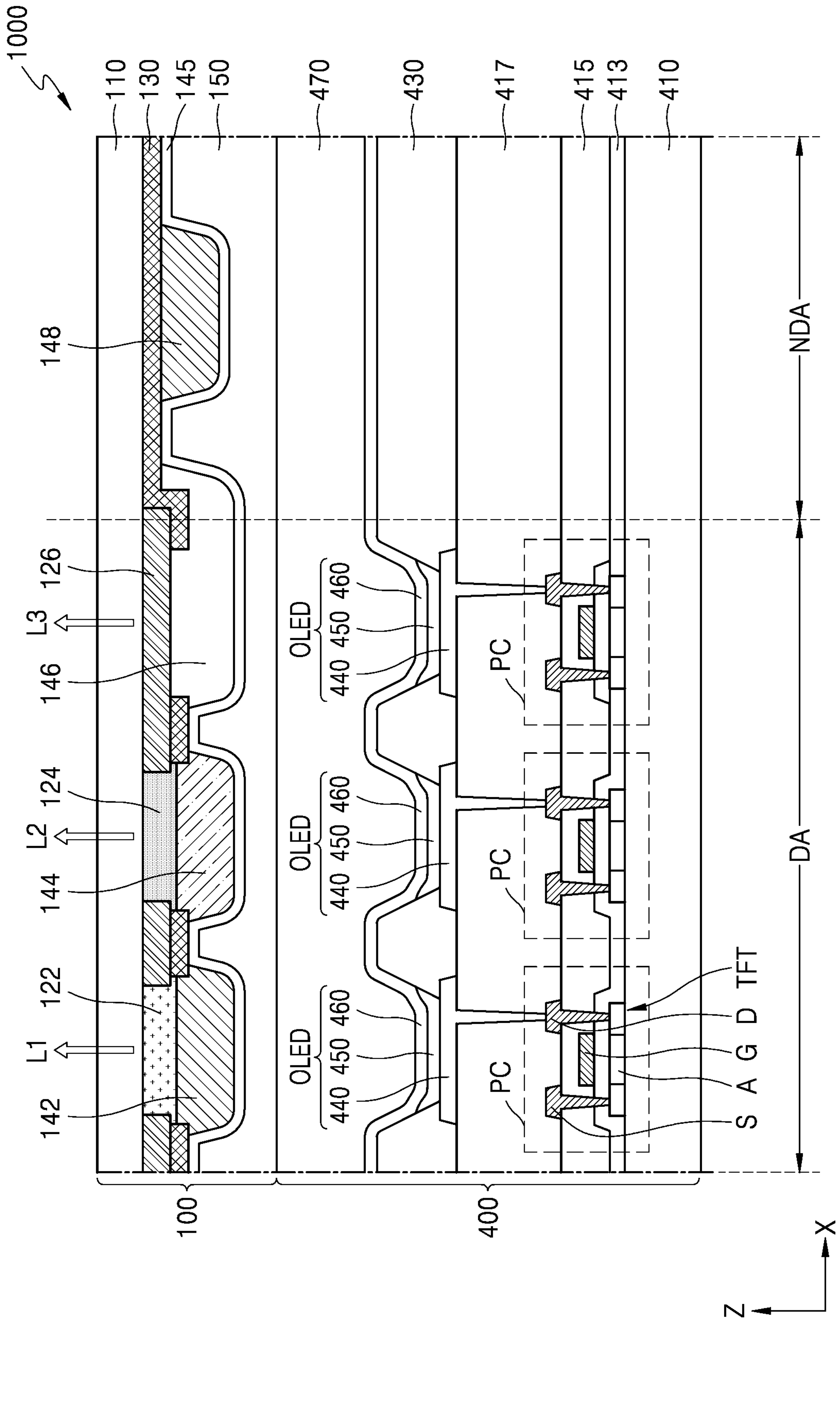
FIG. 6B is a cross-sectional view of a display apparatus according to one or more embodiments of the present disclosure.

FIGS. 6A and 6B are cross-sectional views of the display apparatus 1000 according to one or more embodiments of the present disclosure. FIGS. 6A and 6B may be cross-sectional views of the display apparatus 1000 when the display apparatus 1000 of FIG. 1A is cut along line I-I'.

FIG. 6A is a cross-sectional view of the display apparatus 1000 including the color panel 100 shown in FIG. 2A, and FIG. 6B is a cross-sectional view of the display apparatus 1000 including the color panel 100 shown in FIG. 2B. Hereinafter, refer to FIGS. 2A and 2B for descriptions of repeated elements.

As shown in FIGS. 6A and 6B, the display panel 400 may include the plurality of emission elements OLED, and the plurality of emission elements OLED may be arranged to overlap the plurality of pixel areas of the color panel 100, respectively.

Figure 7A:
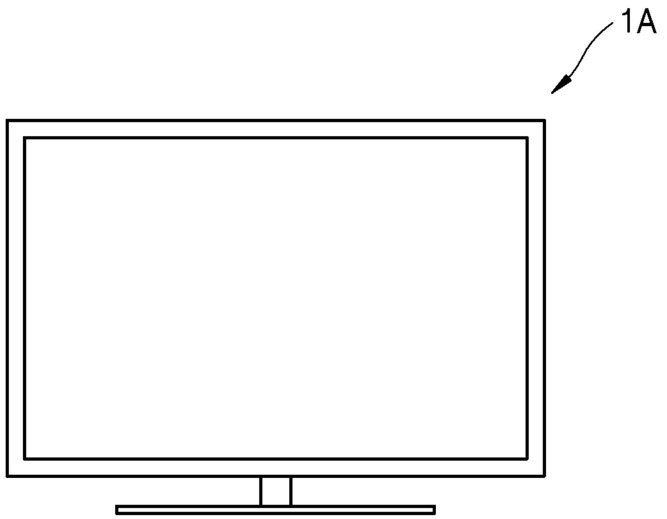
FIGS. 7A-7C are schematic diagrams of a display apparatus according to one or more embodiments of the present disclosure.
Figure 7B:
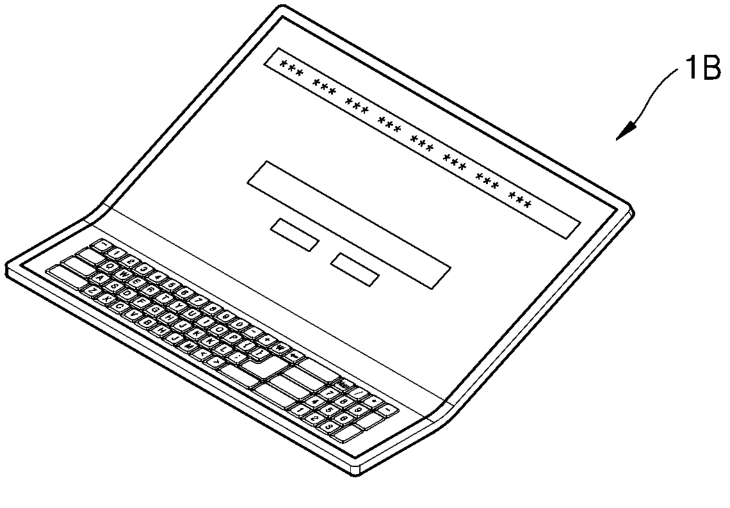
Figure 7C:
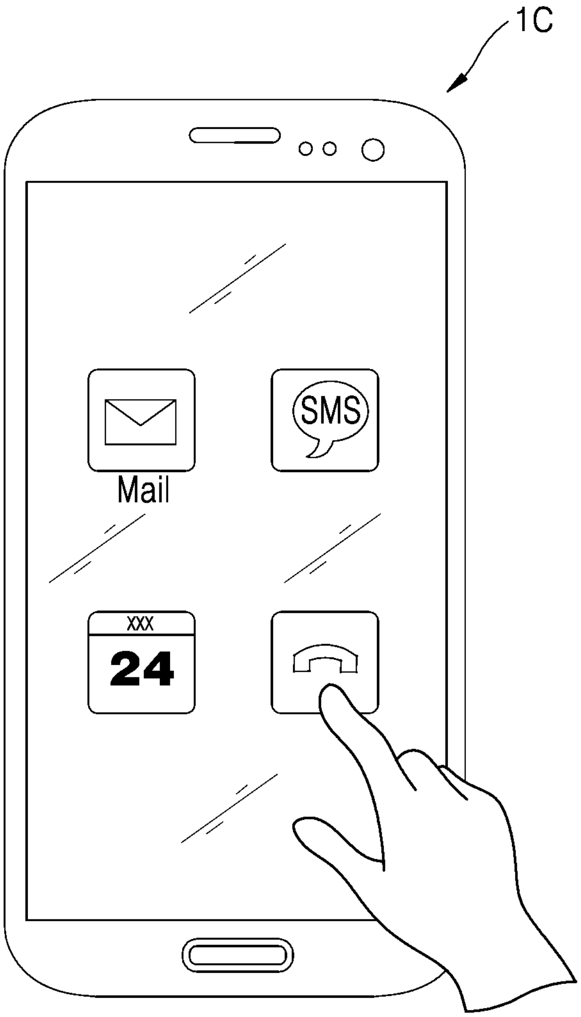

The display apparatus 1000 including the above-stated structure may be a television 1A as shown in FIG. 7A, a laptop computer and/or a foldable tablet PC 1B as shown in FIG. 7B, and/or a portable display 1C (such as a mobile phone) as shown in FIG. 7C. In some embodiments, the display apparatus may be applied to a display portion provided in an artificial intelligence speaker. A structure according to embodiments of the present disclosure is not limited to a particular electronic device as long as the electronic device is capable of providing a certain image.

According to embodiments of the present disclosure, in the display apparatus, oxidization and/or deterioration of the color conversion elements arranged in the display area may be minimized (or reduced), and thus, a color panel having improved display characteristic and/or reliability, and a display apparatus including the color panel, may be provided. The scope of the present disclosure is not limited by the effects described above.

As used herein, expressions such as "at least one of", "one of", and "selected from", when preceding a list of elements, modify the entire list of elements and do not modify the individual elements of the list.

Further, the use of "may" when describing embodiments of the present disclosure refers to "one or more embodiments of the present disclosure". Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly. As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A color panel comprising:

a substrate comprising a display area and a non-display area at least partially surrounding the display area, the display area comprising a plurality of pixel areas;

a color filter layer on the substrate;

a color conversion layer on the color filter layer, the color conversion layer comprising a dummy element that is apart from the display area and is in the non-display area;

a capping layer on the color conversion layer, the capping layer comprising a transmissive inorganic insulating material;

a light-shielding member between the substrate and the color conversion layer, the light-shielding member being in the non-display area and between any two pixel areas of the plurality of pixel areas, a dummy color filter that is apart from the dummy element and is in at least a portion of the non-display area, wherein the color conversion layer further comprises a plurality of quantum dots and light-scattering particles, wherein the plurality of quantum dots are to convert light incident on the color conversion layer into converted light having wavelength bands comprising a first wavelength band and a second wavelength band, different from a third wavelength band of the light incident on the color conversion layer, and output the converted light, wherein the light-scattering particles are to transmit the light of the third wavelength band incident on the color conversion layer, wherein the dummy element is between the display area and the dummy color filter, wherein the dummy element and the dummy color filter do not overlap with each other in a thickness direction of the color panel and have at least a portion of the capping layer therebetween, wherein the dummy color filter comprises a double-layer structure comprising a first dummy color filter and a second dummy color filter stacked in the thickness direction of the color panel, wherein the first dummy color filter and the second dummy color filter comprise different materials, wherein the capping layer covers the dummy element and dummy color filter, wherein the plurality of pixel areas comprises a first pixel area, a second pixel area, and a third pixel area, and the color filter layer comprises:

a first color filter to cover the first pixel area and configured to transmit light of the first wavelength band;

a second color filter to cover the second pixel area and configured to transmit light of the second wavelength band; and a third color filter to cover the third pixel area and configured to transmit light of the third wavelength band, wherein the first wavelength band, the second wavelength band, and the third wavelength band are each different wavelength bands, wherein the color panel further comprises:

a light-shielding color filter between the substrate and the light-shielding member and in direct contact with the light-shielding member, the light-shielding color filter corresponding to an area between the first pixel area and the second pixel area, and the light-shielding color filter comprises the same material as that of the third color filter.

2. The color panel of claim 1, wherein the color conversion layer comprises:

a first element to cover the first pixel area, a second element to cover the second pixel area, and a third element to cover the third pixel area, wherein the third element comprises:

a first portion in the display area, and a second portion that is integral with the first portion and is in the non-display area, and wherein the first element, the second element, the third element, and the dummy element are arranged apart from one another.

3. The color panel of claim 2, wherein the dummy element comprises the same material as that of the first element, the second element, and/or the third element.

4. The color panel of claim 1, wherein a portion of the third color filter is between the substrate and the light-shielding member.

5. The color panel of claim 2, wherein the first element, the second element, the third element, and the dummy element each correspond to any one of:

a first color conversion element comprising some of the plurality of quantum dots to convert the light of the third wavelength band incident on the color conversion layer into light of the first wavelength band;

a second color conversion element comprising others of the plurality of quantum dots to convert the light incident of the third wavelength band on the color conversion layer into light of the second wavelength band different from the first wavelength band; or a light-transmitting element comprising light-scattering particles to transmit the light of the third wavelength band incident on the color conversion layer.

6. A display apparatus comprising:

a display panel comprising a plurality of emission elements; and a color panel on the display panel and comprising a plurality of pixel areas to overlap the plurality of emission elements, wherein the color panel further comprises:

a substrate comprising a display area and a non-display area surrounding the display area, the display area comprising the plurality of pixel areas;

a light-shielding member arranged to correspond to the non-display area;

a color filter layer;

a color conversion layer on the color filter layer, the color conversion layer comprising a dummy element that is apart from the display area and is in the non-display area;

a capping layer on the color conversion layer, the capping layer comprising a transmissive inorganic insulating material; and a dummy color filter that is apart from the dummy element and is in at least in a portion of the non-display area, wherein the color conversion layer further comprises a plurality of elements in the display area, wherein the dummy element is between the display area and the dummy color filter, wherein the dummy element and the dummy color filter do not overlap with each other in a thickness direction of the color panel and have at least a portion of the capping layer therebetween, wherein the dummy color filter comprises a double-layer structure comprising a first dummy color filter and a second dummy color filter stacked in the thickness direction of the color panel, wherein the first dummy color filter and the second dummy color filter comprise different materials, wherein one of the plurality of elements of the color conversion layer comprises a first portion located in the display area and a second portion, integral with the first portion, and located in the non-display area, wherein the capping layer covers the dummy element and dummy color filter, and wherein the plurality of pixel areas comprises a first pixel area, a second pixel area, and a third pixel area, wherein the color filter layer comprises:

a first color filter to cover the first pixel area and configured to transmit light of a first wavelength band;

a second color filter to cover the second pixel area and configured to transmit light of a second wavelength band; and a third color filter to cover the third pixel area and configured to transmit light of a third wavelength band, wherein the first wavelength band, the second wavelength band, and the third wavelength band are each different wavelength bands, wherein the color panel further comprises:

a light-shielding filter between the first color filter and the second color filter, in direct contact with the light-shielding member, and comprising the same material as that of the third color filter.

7. The display apparatus of claim 6, wherein the plurality of elements of the color conversion layer comprises:

a first color conversion element to convert light incident on the color conversion layer into light of the first wavelength band;

a second color conversion element to convert the incident light into light of the second wavelength band different from the first wavelength band; and a light-transmitting element.

8. The display apparatus of claim 7, wherein the one of the plurality of elements comprises any one selected from the first color conversion element, the second color conversion element, and the light-transmitting element.

9. The display apparatus of claim 7, wherein the dummy element is arranged apart from the one of the plurality of elements.

10. The display apparatus of claim 9, wherein the light incident on the color filter layer comprises the light of the first wavelength band, the light of the second wavelength band, and light of a third wavelength band.

11. The display apparatus of claim 10, wherein the dummy element comprises the same material as that of at least one selected from the first color conversion element, the second color conversion element, the first color filter, and the second color filter.

12. A display apparatus comprising:

a display panel comprising a first emission element, a second emission element, and a third emission element; and a color panel on the display panel and comprising a plurality of pixel areas, wherein the color panel comprises:

a substrate comprising a display area and a non-display area at least partially surrounding the display area, a color filter layer on the substrate, a color conversion layer on the color filter layer, the color conversion layer comprising a dummy element that is apart from the display area and is in the non-display area, a capping layer on the color conversion layer, the capping layer comprising a transmissive inorganic insulating material, a light-shielding member between the substrate and the color conversion layer, a dummy color filter that is apart from the dummy element and is in at least in a portion of the non-display area, wherein the color conversion layer further comprises a plurality of quantum dots and light-scattering particles, wherein the plurality of quantum dots are to convert light incident on the color conversion layer and of a third wavelength band into converted light having wavelength bands comprising a first wavelength band and a second wavelength band and output the converted light, wherein the plurality of quantum dots comprise first quantum dots and second quantum dots, wherein the light-scattering particles are to transmit light of the third wavelength band incident on the color conversion layer, and wherein the color conversion layer comprises;

a first element to overlap a first emission element, a second element to overlap a second emission element, a third element to overlap a third emission element, and a dummy element in at least a portion of the non-display area, wherein the first element, the second element, the third element, and the dummy element are apart from one another, wherein the dummy element is between the display area and the dummy color filter, wherein the dummy element and the dummy color filter do not overlap with each other in a thickness direction of the color panel and have at least a portion of the capping layer therebetween, wherein the dummy color filter comprises a double-layer structure comprising a first dummy color filter and a second dummy color filter stacked in the thickness direction of the color panel, wherein the first dummy color filter and the second dummy color filter comprise different materials, wherein the capping layer covers the dummy element and dummy color filter, and wherein the plurality of pixel areas comprises a first pixel area, a second pixel area, and a third pixel area, wherein the color filter layer comprises:

a first color filter to cover the first pixel area and configured to transmit light of the first wavelength band;

a second color filter to cover the second pixel area and configured to transmit light of the second wavelength band; and a third color filter to cover the third pixel area and configured to transmit light of the third wavelength band, wherein the first wavelength band, the second wavelength band, and the third wavelength band are each different wavelength bands, wherein the color panel further comprises:

a material portion between the first color filter and the second color filter, in direct contact with the light-shielding member, and comprising the same material as that of the third color filter.

13. The display apparatus of claim 12, wherein a portion of the third element of the color conversion layer extends toward the non-display area and covers a portion of the non-display area.

14. The display apparatus of claim 12, wherein one selected from the first element or the second element comprises the first quantum dots to convert the light of the third wavelength band incident on the color conversion layer into light of the first wavelength band, another one selected from the first element or the second element comprises the second quantum dots to convert the light of the third wavelength band incident on the color conversion layer into light of the second wavelength band, and the third element comprises the light-scattering particles.

15. The display apparatus of claim 14, wherein the dummy element comprises:

the same material as that of any one of the first element, the second element, or the third element.

16. The display apparatus of claim 12, wherein the first color filter to overlap the first element;

the second color filter to overlap the second element; and the third color filter to overlap the third element.

17. The display apparatus of claim 16, wherein the dummy color filter comprises:

the same material as that of any two color filters from among the first color filter, the second color filter, and the third color filter.

* * * * *